United States Patent
Yoshioka (12) 
(10) Patent No.: US 6,380,492 B1
(45) Date of Patent: Apr. 30, 2002

(54) CONTACT FILM USED FOR DEVICES HAVING BALL GRID ARRAY STRUCTURE AND DEVICE MOUNTING STRUCTURE

(75) Inventor: Hiroyuki Yoshioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/688,198

(22) Filed: Oct. 16, 2000

(30) Foreign Application Priority Data

Nov. 12, 1999 (JP) .......................................... 11-323192

(51) Int. Cl.[7] ................................................. H05K 1/03
(52) U.S. Cl. ......................... 174/256; 174/259; 29/832; 257/737
(58) Field of Search ................................. 174/256, 259, 174/255, 261; 257/737, 738, 778, 734; 29/832; 438/584, 612

(56) References Cited

U.S. PATENT DOCUMENTS 4,691,188 A * 9/1987 Watanabe et al. ............ 338/307
5,461,775 A * 10/1995 Tanabe et al. ................. 29/832
6,111,317 A * 8/2000 Okada et al. ............... 257/737

FOREIGN PATENT DOCUMENTS

| JP | 403280492 A | * 12/1991 | ................. 29/831 |
| JP | 11-26128 | 3/1992 | |
| JP | 08-37255 | 2/1996 | |

* cited by examiner

Primary Examiner—Albert W. Paladini
(74) Attorney, Agent, or Firm—Armstrong, Westerman Hattori, LLP (57) ABSTRACT

The present invention is a contact film for making electrical contact with a ball grid array device in which a plurality of solder balls is deployed in a lattice configuration as external terminals, comprising: a first elastic insulating film having multiple contact openings provided at positions corresponding to the solder balls, and first contact patterns for making first contact with the solder balls about the peripheries of the openings; and a second elastic insulating film, laminated to the first elastic insulating film, having second contact patterns for making second contact with the solder balls through the openings at positions corresponding to the openings; wherein it is possible to verify the electrical contact of the solder balls by whether or not there is electrical continuity between the first and the second contact patterns.

17 Claims, 7 Drawing Sheets

331. 321. 311. Contact opening
332. 322. 312. First contact pattern
323. 313. Through hole
324. 314. Dummy pad
345. 335. 325. 315. Pullout pattern
336. 326. Lower layer opening
337. 327. Lower layer contact pad
341. Second contact pattern

FIG. 6A
Front

FIG. 6B
Back

FIG. 7

CONTACT FILM USED FOR DEVICES HAVING BALL GRID ARRAY STRUCTURE AND DEVICE MOUNTING STRUCTURE

BACKGROUND OF THE INVENTION

1. Field of the Invention

This invention relates to a contact film used for devices having a ball grid array structure which uses solder balls as external terminals and to a mounting structure for such devices, and particularly to a contact film and a device mounting structure wherewith verification of the electrical contact with the solder balls constituting the external terminals can be easily made, and wherewith more stable contacts are provided.

2. Description of the Related Art

There is an increasingly strong demand for super-miniaturization in semiconductor devices built into such very small and lightweight information instruments as portable terminals, portable telephones, and digital cameras. In response to such demand, semiconductor devices having a ball grid array (BGA) structure, wherein solder balls are deployed in a lattice configuration as the external terminals of the package, are being widely used. Large LSIs such as microprocessors and ASICs require a very large number of input/output terminals, and the BGA package structure is becoming indispensable in order to make that necessity compatible with the demands for super-miniaturization.

With such BGA type devices, how to perform accelerated tests and performance tests is a very important issue. With a BGA type device which uses solder balls as the external terminals, in tests prior to shipment, it is not possible to melt (reflow) the solder balls and effect mounting on a test board. It is the device customer who ultimately melts the solder balls and effects mounting by mounting on a print board, and what is demanded of the device manufacturers is that they perform accelerated tests and performance tests, effecting mounting on a test board without causing a deterioration in the shape and so forth of the solder balls.

Of the test sockets for BGA type devices conventionally proposed, such as in Japanese Patent Application Laid-Open No. H8-37255, for example, the structure thereof is such that openings are provided in the socket electrodes, the BGA solder balls are caused to make contact such that they are accommodated in those openings, and a socket cover is pressed down from above. This test socket only succeeds in improving the sureness of the electrical contacts, and cannot actually verify the electrical contacts.

Also proposed, in Japanese Patent Application Laid-Open No. H11-26128, is a contact film wherewith, in order both to make electrical contact with external terminals possible and to eliminate damage to the solder balls, a conductive connection pad and conducting pattern are formed between flexible multi-layer insulating layers, the connection pad is exposed through a window formed in the outermost insulating layer, and the solder balls of the device are pressed against the connection pad to make contact therewith. However, although it is possible, by employing flexible multi-layer insulating layers, to prevent damage to the solder balls in the testing process, and to more surely effect contact even with solder balls exhibiting variation in diameter, it is not possible with the contact film proposed here to verify the electrical contact with the solder balls.

In yet another proposal, in Japanese Patent Application No. H-10-365591 filed (on Dec. 22, 1998) by this patent applicant, a new test socket is proposed wherewith attaching a contact film that contacts a BGA type device is made possible, and the use of a common test socket for various models of BGA device is made possible. Nevertheless, even this contact film cannot verify electrical contact with the solder balls.

SUMMARY OF THE INVENTION

That being so, an object of the present invention is to provide a contact film for use with BGA type devices, and a mounting structure using that contact film, wherewith electrical contact with the solder balls can be verified.

Another object of the present invention is to provide a contact film for use with BGA type devices, and a mounting structure using that contact film, wherewith electrical contact with the solder balls can be stabilized.

Yet another object of the present invention is to provide a contact film for use with BGA type devices, and a mounting structure using that contact film, wherewith electrical contact with the solder balls is effected without damaging them.

In order to attain the objects stated above, a first aspect of the present invention is a contact film for making electrical contact with a ball grid array device in which a plurality of solder balls is deployed in a lattice configuration as external terminals, comprising: a first elastic insulating film having multiple contact openings provided at positions corresponding to the solder balls, and first contact patterns for making first contact with the solder balls about the peripheries of the openings; and a second elastic insulating film, laminated to the first elastic insulating film, having second contact patterns for making second contact with the solder balls through the openings at positions corresponding to the openings; wherein it is possible to verify the electrical contact of the solder balls by whether or not there is electrical continuity between the first and the second contact patterns.

According to the invention described above, the diameter of the openings provided in the first flexible insulating film is smaller than the diameter of the solder balls, but those holes are formed in such size as that the bottommost points of the solder balls just make contact with the second contact pattern. Then, by providing the first contact patterns at the peripheries of the openings and mounting such that the solder balls are pressed thereagainst, the solder balls can contact the first contact patterns more surely without being damaged. Furthermore, because the second contact patterns with which the bottommost points of the solder balls make contact are deployed below the openings, it is easy to verify whether or not the solder balls are in contact with the first contact patterns by verifying the electrical contact between the first and the second contact patterns.

In a preferable embodiment of the present invention, the first flexible insulating film has a multi-layer structure. Also, the first flexible insulating film is configured in N layers for a BGA device having N rows of solder balls. In the case where N=3, for example, first contact patterns and contact openings for the outermost row of solder balls are formed in a first layer film. The first layer film has through holes for respectively passing the solder balls from the second row in.

First contact patterns and contact openings for the second row of solder balls are formed in a second layer film laminated to the first layer film. In the second layer film are provided, furthermore, lower-layer openings at positions corresponding to the outermost row of solder balls and lower-layer contact pads about the peripheries thereof, and through holes for respectively passing the solder balls from the third row in. The first contact patterns of the first layer film and the lower-layer contact pads of the second layer film are in mutual contact, and the one or the other makes contact with the outermost row of solder balls.

First contact patterns and contact openings for the third row of solder balls are formed in a third layer film. In the third layer film are provided, furthermore, lower-layer openings at positions corresponding to the outermost row and the second row of solder balls and lower-layer contact pads about the peripheries thereof. The first contact patterns of the first layer film and the lower-layer contact pads of the second and third layer films are in mutual contact, and one or other thereof makes contact with the outermost row of solder balls. Also, the first contact patterns of the second layer film and the lower-level contact pads of the third layer film are in mutual contact, and the one or the other makes contact with the second row of solder balls.

In cases where the BGA has four or more rows of solder balls, first contact patterns and contact openings corresponding to the N'th row of solder balls are formed on an N layer film, and the N'th row of solder balls contacts that first contact pattern via through holes passed from the first layer film to the N−1 layer film. In that case, the outermost row of solder balls makes contact with the first contact patterns of the first layer film and one of the lower-layer contact pads of the second layer film to the N'th layer film.

The second flexible insulating film is laminated on the lowermost layer of the first flexible insulating film having the multi-layer structure described above. The BGA type device is pressed against the contact film so that the lowermost parts of the solder balls are contacted to the second contact patterns provided in this second flexible insulating film, through the through holes and openings. Also, by checking whether or not there is continuity between the first and the second contact patterns, whether or not the solder balls are in contact with the first contact patterns can be indirectly checked.

Furthermore, by deploying lower-layer contact pads in addition to and below the first contact patterns, the lower-layer contact pads can make sure contact with solder balls having smaller diameters when there is variation in the diameters of the solder balls. Accordingly, even in cases where there is variation in the diameters of the solder balls, the sureness of the contacts of the solder balls with the first contact patterns can be enhanced.

In a preferable embodiment, dummy pads are deployed around the through holes in the films of each layer, in the same manner as the first contact patterns and lower-layer contact pads. By providing these dummy pads at the through holes, the degree of deformation or sag in the contact film having the multi-layer structure can be made about the same at the positions of the solder balls in multiple rows, and the applied pressure can be equalized so that the sureness of the contact between the solder balls and the contact film is enhanced.

According to another aspect of the present invention, a mounting structure for mounting a ball grid array device has a board having an accommodation opening for accommodating the device and the contact film described in the foregoing deployed on the back side of the board, wherein first and second pullout patterns connected to the first and second contact patterns are connected to the wiring patterns in the board. Such a device mounting structure can be used as a test socket. The solder balls are connected to the wiring pattern on the board through the contact film. In addition, the contact between the solder balls and the first contact patterns of the contact film can be indirectly verified by checking the connection between the first and the second contact patterns.

By providing a plurality of accommodation openings in the board, and deploying the contact films described in the foregoing at those respective accommodating openings, a plurality of BGA devices can be mounted on the board. Such a device mounting structure is a useful mounting board for burn-in tests and function tests.

By replacably attaching the contact film to the board, a common device mounting structure can be used for a plurality of types of BGA devices by merely exchanging the contact film. And by replacing worn contact films, the useful life of the device mounting structure can be lengthened.

DESCRIPTION OF THE PREFERRED EMBODIMENTS

An embodiment of the present invention is now described with reference to the drawings. It should be noted, however, that these embodiment aspects do not limit the technical range of the present invention.

Figure 1A:
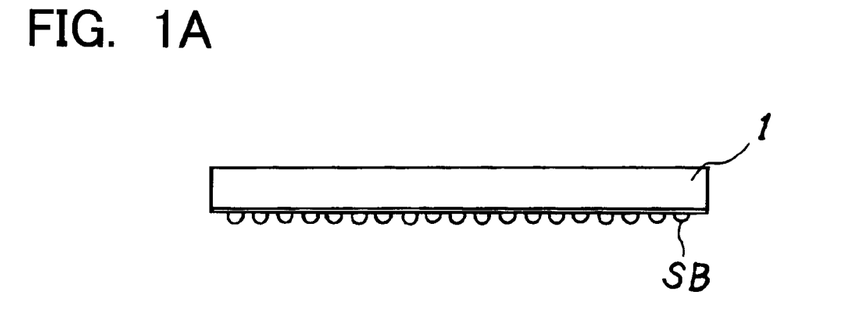
FIG. 1 provides drawings of the external shape of a BGA type device.
Figure 1B:
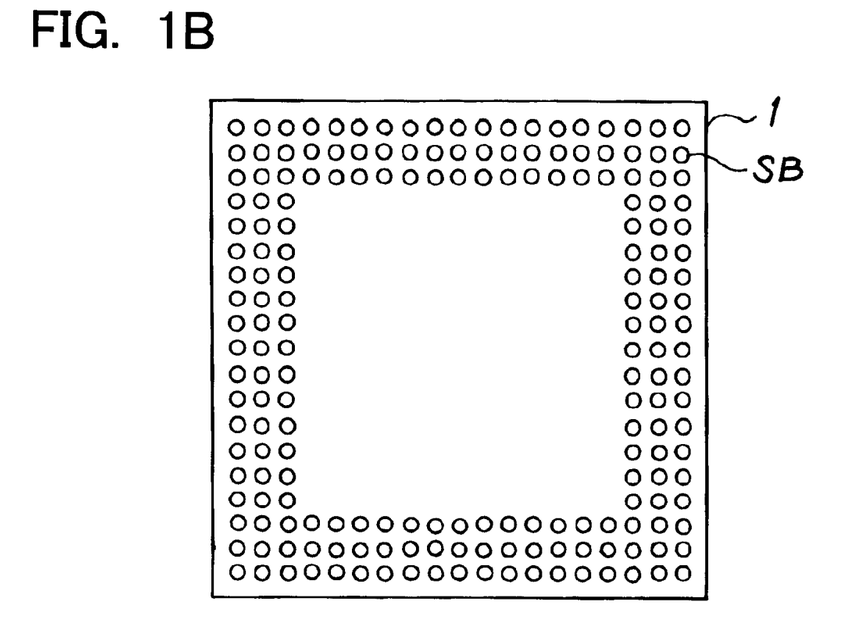

FIG. 1 provides drawings of the external shape of a BGA type device, with FIG. 1A being a side elevation of the device and FIG. 1B being a view of the bottom surface thereof. Solder balls SB are deployed in a lattice configuration in the bottom surface of a package body 1 that accommodates an LSI internally, forming external terminals for making electrical connections with the internal LSI. In the example diagrammed in FIG. 1, three rows of solder balls SB are deployed close together around the peripheral part of the package body 1.

Figure 2A:
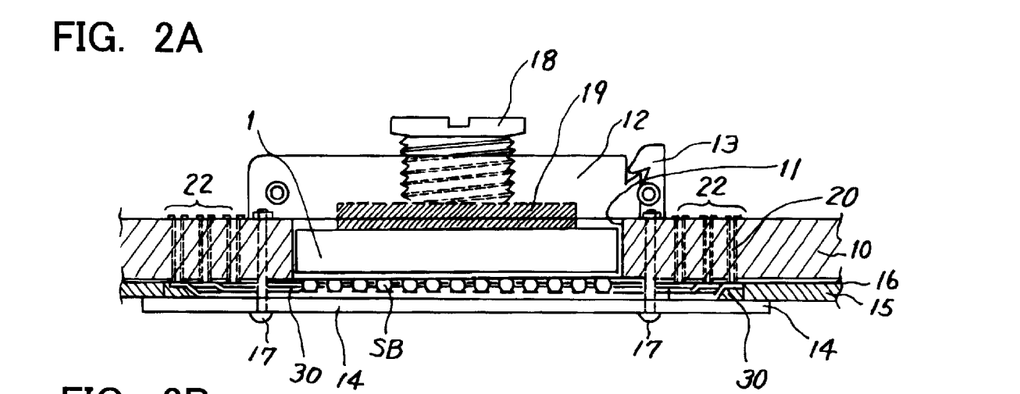
FIG. 2 is a diagram of a device mounting structure for mounting BGA type devices in an aspect of this embodiment.
Figure 2B:
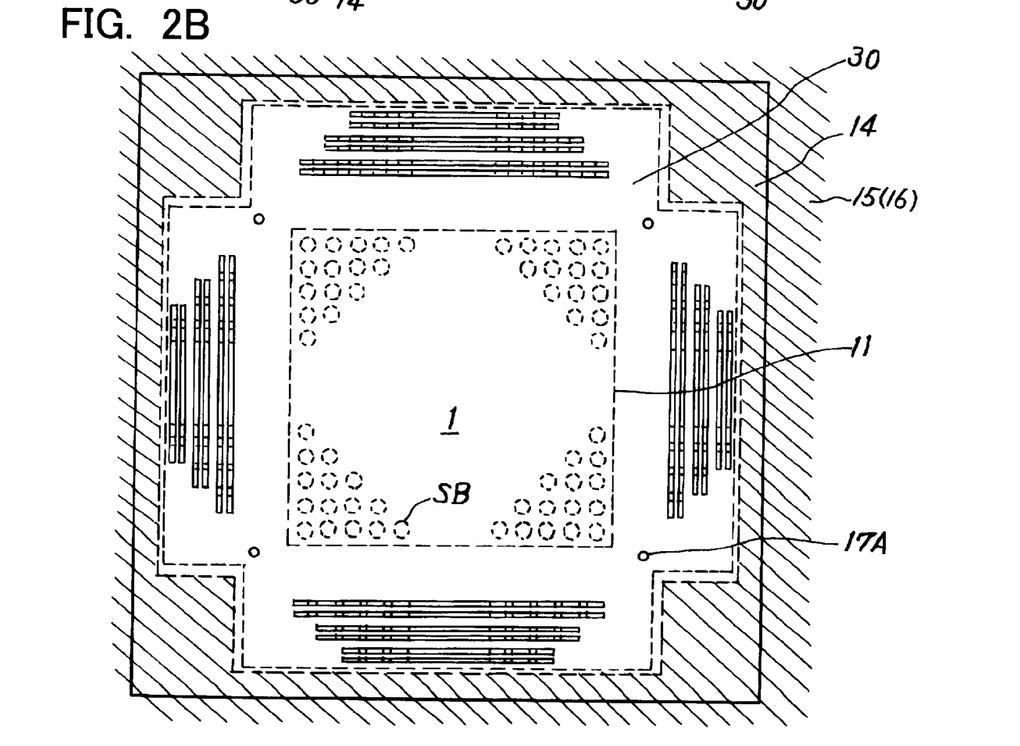

FIG. 2 is a diagram of a device mounting structure for mounting BGA type devices in this embodiment aspect. FIG. 2A is a cross-sectional diagram of the device mounting structure, while FIG. 2B is a bottom view thereof. The device mounting structure diagrammed in FIG. 2 is configured of a printed circuit board 10 provided internally with an electrically conducting pattern and electrically conducting via holes, and a contact film 30, formed on the back side of the device body 1, for making contact with the solder balls. In the board 10 is provided an accommodation hole 11 for accommodating the device 1. The contact film 30 is attached to the lower surface of the board 10, together with a pressure plate 14, by securing screws 17, so as to close off the lower side of the accommodation hole 11. The contact film 30 can be replaced by removing the securing screws 17.

To the accommodation hole 11 of the board 10 is attached an upper cover unit 12 that can be opened and closed, which serves as pressure applying means for applying pressure to the device 1 toward the contact film 30. The upper cover unit 12 is set in a closed condition so as to apply pressure to the device 1 by a turnable locking lever 13 attached to the board 10. By opening the locking lever 13, the device 1 accommodated in the accommodation hole 11 can be exchanged with another.

The upper cover unit 12 is also provided with a pressure adjustment screw 18 and with a rubber sheet seat 19 that is an elastic body interposed between that pressure adjustment screw 18 and the upper surface of the device 1. By turning the pressure adjustment screw 18, optimal pressure is applied to the device 1 via the elastic body seat 19 according to the thickness of the accommodated device 1. The rubber sheet seat 19 should be formed of a heat-resistant rubber that can withstand high temperatures during burn-in testing.

About the periphery of the contact film 30, between the bottom surface of the board 10 and the pressure plate 14, a contact film securing frame 15 and an elastic body thickness adjusting sheet 16 which have a thickness that accords with the thickness of the contact film 30 are deployed. Accordingly, as indicated in the bottom surface diagram in FIG. 2B, the layered assembly of the pressure plate 14, contact film 30, securing frame 15, and board 10 is held in a single unit by the securing screws 17 which are inserted in securing screw holes 17A in the board 10.

The device mounting structure diagrammed in FIG. 2 functions as a device socket when the board 10 has a single accommodation hole 11. When a plurality of accommodation holes 11 are provided in the board 10, and a contact film 30 and pressure plate 14 are attached to each respective accommodation hole 11, it functions as a burn-in test board or function testing board whereon a plurality of devices 1 can be mounted.

By exchanging the contact film 30, the pressure plate 14, securing frame 15, and thickness adjustment sheet 16 according to the device type, the board 10 having the upper cover unit 12 can be used commonly for other device models.

In the contact film 30, as will be described subsequently, first contact patterns for contacting the solder balls SB and second contact patterns for contacting the bottommost part of the solder balls SB are provided. These first and second contact patterns, respectively, are electrically continuous with connection pads provided on the back side of the board 10 through their respective pullout patterns. The connection pads on the back side are connected to front side pads 22 through electrically continuous via holes provided in the board 10. By checking the connection between the first and the second contact patterns, using the back side pads 22, it is possible to check whether or not the solder balls SB are electrically connected to the contact pattern.

The first contact patterns make it possible for signals required for burn-in tests or function tests to be input or output to or from the device 1 by a connection pattern (not shown) provided on the board 10.

Figure 3:
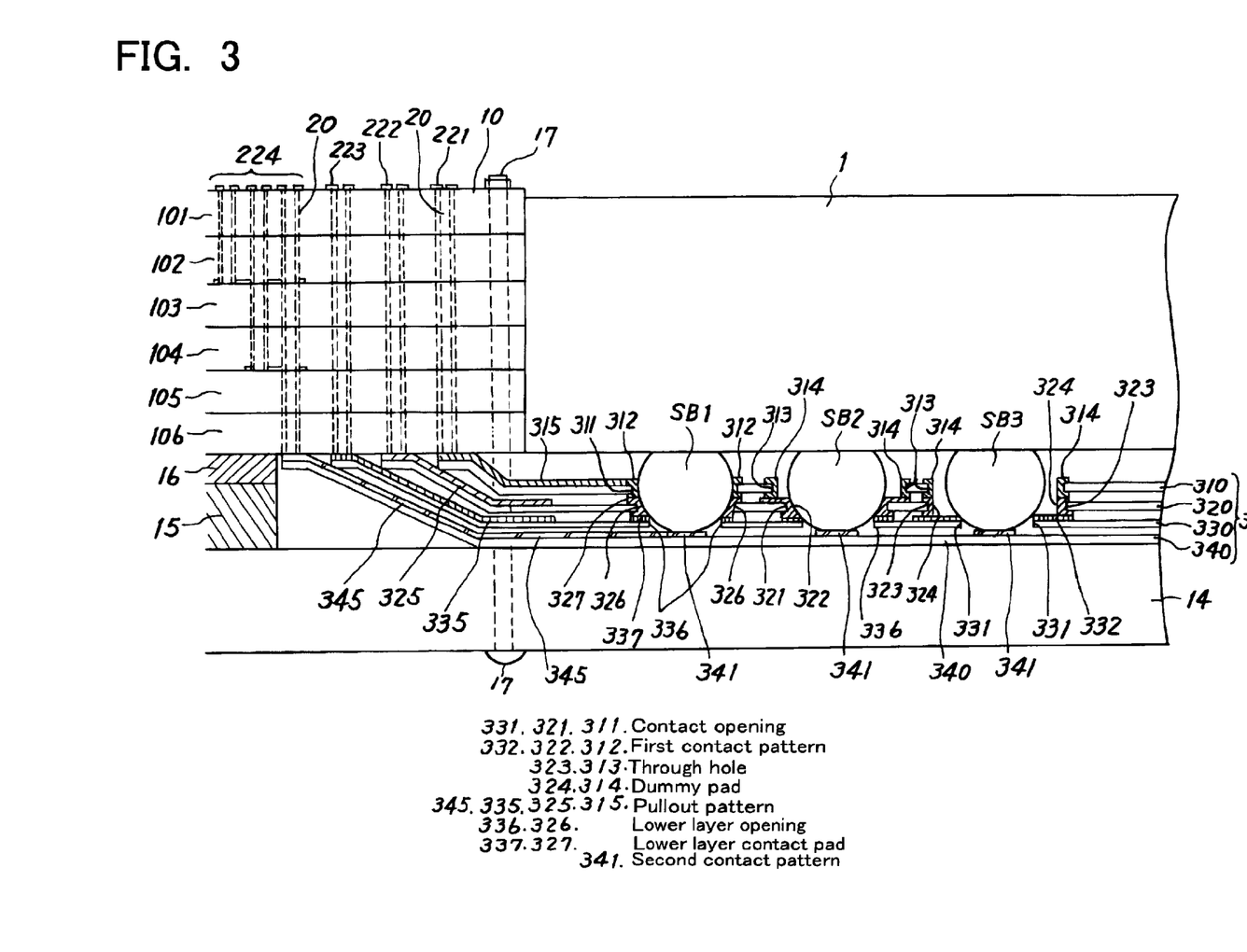
FIG. 3 is a detailed cross-sectional view of a device mounting structure in an aspect of this embodiment.

FIG. 3 is a detailed cross-sectional view of a device mounting structure in this embodiment. The structure of the contact film 30 is represented in detail in FIG. 3. The structure diagrammed in this example in FIG. 3 is that of a contact film 30 in a case where three rows of solder balls SB are deployed in a lattice configuration, as diagrammed in FIG. 1, on the back side of the device 1.

In the contact film 30 are laminated a first flexible insulating film (wherein a first layer film 310, second layer film 320, and third layer film 330 are laminated) and a second flexible insulating film 340. Accordingly, it is structured with a total of four layers of film. This film is a flexible, insulating film such as a polyimide that exhibits elasticity of such a degree as will very slightly flex when pressed against by a solder ball.

In the first layer film 310 are provided contact openings 311, at positions corresponding to the outermost row of solder pads SB1, and first contact patterns 312 formed about the peripheries of those contact openings 311, and, at positions corresponding to the second and third rows of solder pads SB2 and SB3, through holes 313 and dummy pads 314 formed about the peripheries of those through holes 313 that do not make contact with the solder pads.

The first contact patterns 312 are electrically conductive patterns having prescribed diameters formed from the upper surface of the first layer film 310 on the side surfaces and lower surfaces of the openings 311. Similarly, the dummy pads 314 are formed on the side surfaces, upper surfaces, and bottom surfaces of the through holes 313. On the first layer film 310 is formed a first pullout pattern 315 that connects with the first contact pattern 312. The first pullout pattern 315 contacts and is made to press against the connection pads on the lower surface of the board 10. The contact patterns, dummy pads, and pullout pattern are formed by plating.

In the first layer film 310, the solder balls SB1 in the outermost row are accommodated in the contact openings 311, are contacted by the first contact patterns 312 that are plating patterns formed about the peripheries thereof, and are made electrically continuous with the conductive patterns of the input/output terminals (not shown) via the first pullout pattern 315 and connection terminals and via holes deployed in the board 10. Thus the input/output terminals (not shown) on the board 10 and the solder balls SB1 of the BGA device are electrically connected.

In the second layer film 320, at positions corresponding to the outermost row of solder balls SB1, are deployed lower layer openings 326 and lower layer contact pads 327 formed about the peripheries thereof, at positions corresponding to the second row of solder balls SB2, contact openings 321 and first contact patterns 322 are deployed, and at positions corresponding to the third row of solder balls SB3 are deployed through holes 323 and dummy pads 324 formed about the peripheries thereof that do not make contact with those solder balls. The first contact patterns 322 are connected to a first pullout pattern 325 that extends to the periphery of the contact film 30.

The lower layer openings 326 have diameters that are smaller than the contact openings 311 on the first layer film, and the outer diameters of the lower layer contact pads 327 are smaller than those of the first contact pattern 312. The lower layer contact pads 327, moreover, constitute a plating layer formed on the upper surface of the second layer film, the side surfaces of the openings 326, and the bottom surface. These lower layer contact pads 327 make contact with the first contact patterns 312 on the first layer film.

The configuration of the contact openings 321 and the first contact patterns 322 of the second layer film 320 is provided on the upper surface, side surfaces, and lower surface of the film in the same manner as the contact openings 311 and first contact patterns 312 provided in the first layer film 310, and contacts the second row of solder balls SB2. The through holes 323 in the second layer film 320 have diameters such that the third row solder balls SB3 will pass therethrough, and have dummy pads 324 deployed about the peripheries thereof.

In the third layer film 330, at positions corresponding to the outermost row and second row of solder balls SB1 and SB2, are deployed lower layer openings 336 and lower layer contact pads 337 about the peripheries thereof, and at positions corresponding to the third row of solder balls SB3, contact openings 331 and first contact patterns 332 are deployed.

The lower layer contact pads 337 deployed on the third layer film 330 and the first contact patterns 332 differ from those of the first layer and second layer in that they are deployed only on the upper surface of the third layer film. Also, the lower layer contact pads 337 make contact with the first contact patterns 322 and the lower layer contact pads 327 on the upper layer thereof. The first contact patterns 332, moreover, make contact with the solder-balls SB3 that pass through the through holes 313 and 323 thereabove. And the first contact patterns 332 are connected to the first pullout pattern 335.

The lowermost parts of the solder balls SB1, SB2, and SB3 in the first, second, and third rows respectively make contact with second contact patterns 341 formed on a fourth layer film 340 via openings and through holes. These second contact patterns 341 are connected via a second pullout pattern 345 on the contact film 30 to checking pads 224 deployed on the board 10.

The outermost row of solder balls SB1 makes contact at one of the hemispherical contact shapes formed by the lower layer contact pads 327 and 337 in the second layer and third layer and the first contact pattern 312 on the first layer film. There being variation in the diameters of the solder balls SB1, these hemispherical contact shapes facilitate contact, even if the solder ball has a diameter that is smaller than standard. Hence the sureness of the contact of the solder balls with the first contact pattern can be enhanced.

Dummy pads 314 and 324 are also formed about the peripheries of the through holes 313 and 314 in the same manner as the contact patterns and contact pads. By implementing such a configuration, when the solder balls are pressed against the contact film 30, similar flex is produced at the respective openings and through holes. Hence it is possible to impart uniform shape changes to the contact film 30 for all of the solder balls, and to apply the amount of pressure from the device body 1 uniformly to the solder balls deployed in a lattice configuration. As a result, alteration in the solder balls can be prevented and contact sureness enhanced.

The board 10 in the example diagrammed in FIG. 3 has a six-layer structure, with prescribed conducting patterns formed in each layer. The first pullout patterns 315, 325, and 335 and the second pullout pattern 345 of the contact film 30 are respectively connected to surface connection pads 221, 222, 223, and 224 from the lower surface connection pads formed respectively on the board 10 through via holes 20. By checking the electrical continuity between these connection pads, it is possible to indirectly check whether the solder balls are electrically connected to the first contact pattern.

Figure 4:
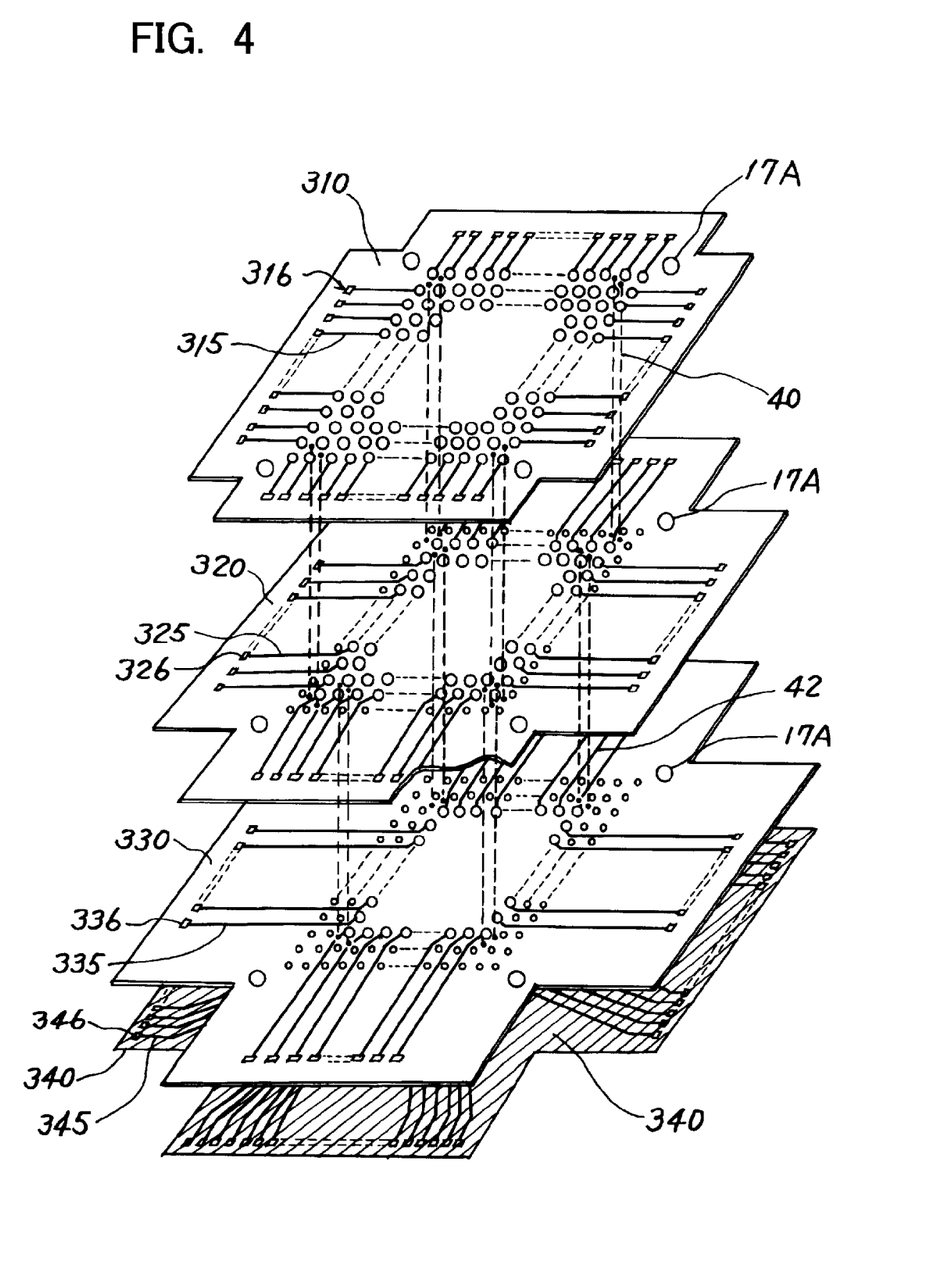
FIG. 4 is an exploded view of a contact film.

FIG. 4 provides an exploded view of a contact film. As diagrammed in FIG. 3, the contact film 30 has four films, namely 310, 320, 330, and 340, laminated therein. The outer shape of the first layer film 310 is the smallest, with the outer shapes of the lower films 320, 330, and 340 becoming successively larger. Thus the connection pads 316, 326, 336, and 346 connected to the first pullout patterns 315, 325, 335, and 345, respectively, connecting to the first contact patterns of the film are respectively exposed.

The connection pads 316 to 346 are respectively aligned in single rows. However, when the pitch between the first contact patterns is small, it is preferable that those connection pads 316 to 346 be arrayed in two or three rows. The first pullout patterns. 315 to 345 may be deployed in a spreading fan shape. In that way, the pitch between the connection pads 316 to 346 in each film can be made larger than the pitch between the first contact patterns.

In each film are provided pads 40 and 42 as positioning marks to be used when laminating. By laminating with these pads lined up, the positions of the through holes and openings in the films can be aligned (matched). The films are provided with securing screw holes 17A for the insertion of securing screws. These securing screw holes 17A are provided with a certain margin to facilitate insertion of the securing screws, wherefore it is not recommended that they be used for positioning when laminating. However, if these securing screw holes 17A are formed with high precision, then it is possible to use them for positioning when laminating.

As diagrammed in FIG. 4, the pullout patterns 315 to 345 connecting to the first contact patterns in the various films pass through the spaces between the lower layer contact pads on the outside and connect to the connection pads 316 to 346.

Figure 5:
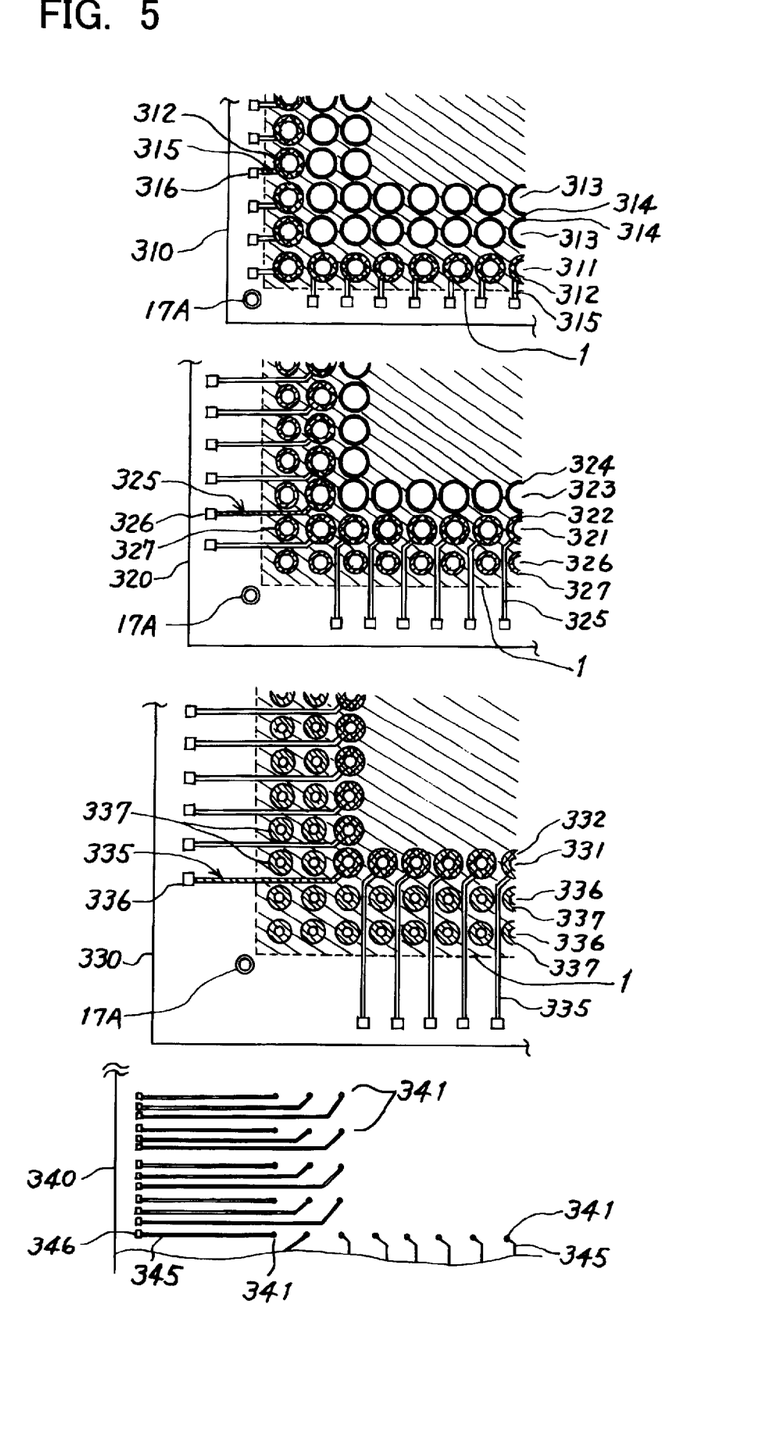
FIG. 5 provides partial configuration diagrams for various layers in a contact film.

FIG. 5 provides partial configuration diagrams for various layers in the contact film. In FIG. 5, a partial upper surface diagram is given for each film 310 to 340 in the first to the fourth films. However, whereas the shapes of the several layers of films in FIG. 4 have overall cross-like shapes with the corner portions cut away, in FIG. 5 such shapes are not represented. Nevertheless, FIG. 5 diagrams in detail how the contact openings 311, 321, and 331, the first contact patterns 312, 322, and 332 about the peripheries thereof, the through holes 313 and 323, the dummy pads 314 and 324 about the peripheries thereof, the lower layer openings 326 and 336, and the lower layer contact pads 327 and 337 about the peripheries thereof are arranged relative to the device 1.

Also diagrammed are the first pullout patterns 315, 325, and 335 that connect to the connection pads 316, 326, and 336 for connecting between the board 10 and the first contact patterns 312, 322, and 332, in the several films. As diagrammed in FIG. 5, in the first layer film 310, this first pullout pattern is a pattern that connects directly from the first contact patterns 312, and in the second layer film 320, the first pullout pattern 325 connects to the outside to connection pads 326 through spaces between the lower layer contact pads 327 corresponding to the outermost row of solder balls. And in the third layer film 330, the first pullout pattern 335 connects to the connection pads 336 through the spaces between the lower layer contact pads 337 on the outside.

As will be described subsequently, the outer diameters in the first contact patterns 312 on the uppermost layer 310 contacting the solder balls are larger than the outer diameters of the lower layer contact pads 327, 337. Not only so, but the outer diameters of the through holes 313, 323 formed in the several layers and the dummy pads 314, 324 about the peripheries thereof are larger than those of the lower layer contact pads 327, 337, making them about the same as the diameters of the first contact patterns 312. Accordingly, by forming the first contact patterns 312, 322, and 332 sequentially from the outside in the first, second, and third layers, the first pullout patterns 315, 325, 335 can be pulled out from the first contact patterns 312, 322, 332 formed about the circumference on the inside, to the connection pads 316, 326, 336 at the periphery of the film.

In FIG. 5 is given a plan of the film 340 in the fourth layer (second flexible insulating film). The second contact patterns 341 contacting the lowermost surfaces of the solder balls are arrayed in a lattice configuration, and these second contact patterns 341 are connected to the connection pads 346 via the second pullout pattern 345. In this film 340 in the lowermost layer, only the second contact pads 341 having small diameters are deployed, wherefore the second pullout pattern 345 pulled out therefrom can be formed so that there is comparatively more spatial leeway.

Figure 6A:
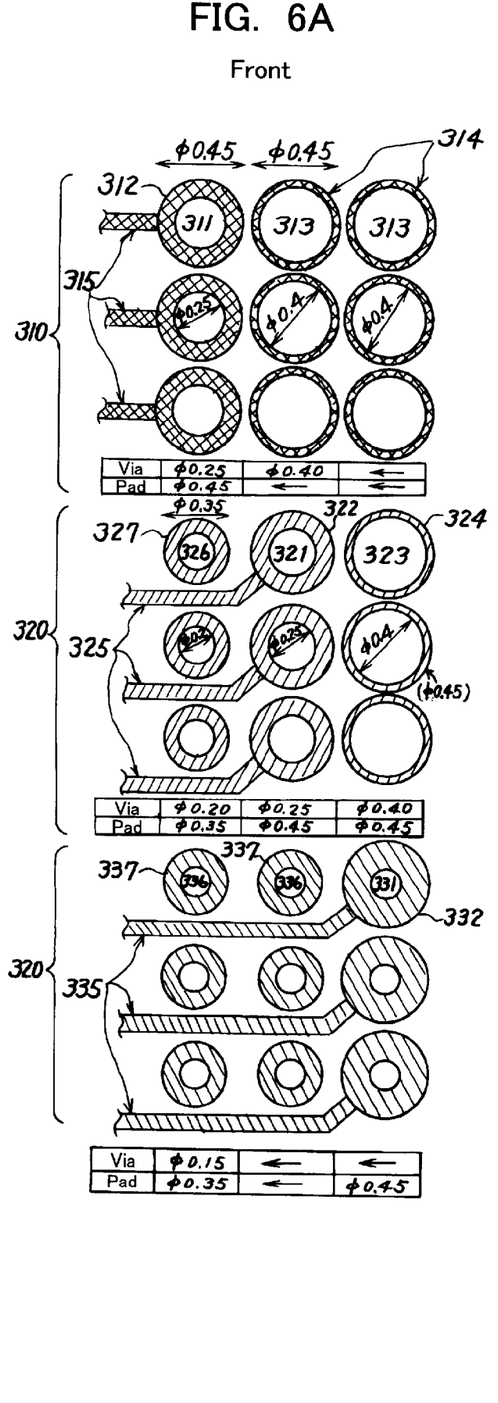
FIG. 6 provides diagrams of back-side patterns in various layers in a contact film.
Figure 6B:
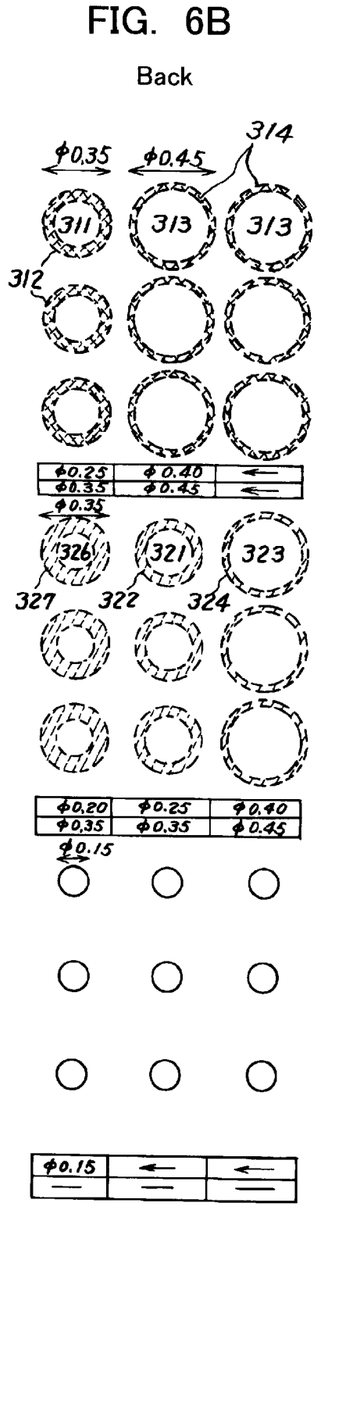

FIG. 6 provides diagrams of front and back side patterns in the several layers in the contact film. In FIG. 6 are diagrammed specific dimension examples for the openings and through holes, and examples of the outer diameters of the first contact patterns, lower layer contact pads, and dummy pads formed about the peripheries thereof. The front side is diagrammed in FIG. 6A and the back side in FIG. 6B.

On the front side of the first layer film 310, at the positions of outermost row of solder balls, are deployed contact openings 311, first contact patterns 312 about the peripheries thereof, and a first pullout pattern 315 connecting thereto. At the positions of the second and third rows of solder balls are deployed the through holes 313 and the dummy pads 314 about the peripheries thereof. On the back side of the first layer film are deployed the first contact patterns 312 and dummy pads 314. As diagrammed in the drawing, the through holes 313 have larger diameters than do the contact openings 311.

On the front side of the second layer film 320, at the positions of the outermost row of solder balls, are deployed the lower layer openings 326 and lower layer contact pads 327 about the peripheries thereof. At the positions of the second row of solder balls are deployed the contact openings 321 and the first contact patterns 322 about the peripheries thereof. At the positions of the third row of solder balls, are deployed through holes 323 and dummy pads about the peripheries thereof. On the back side also, similarly, are deployed, respectively, the lower layer contact pads 327, first contact patterns 322, and dummy pads 324.

The lower layer openings 326 having smaller diameters than do the contact openings 311 in the first layer film, and the lower layer contact pads 327 about the peripheries thereof have outer diameters that are smaller than do the first contact patterns 312 and 322. Thus the first pullout patterns 325 are able to be deployed so that they pass between the lower layer contact pads 327.

In a third layer film 335 that is the lowermost layer in a multi-layer film that configures a first flexible insulating film for effecting connections with solder balls, lower layer contact pads 337 and first contact patterns 332 are formed only on the front side. These pads and patterns are not formed on the back side. That is because, as diagrammed in FIG. 5, below the third layer film, the contact verification film 340 provided with the second contact patterns 341 is stacked on, in order to secure insulation between the second contact patterns 341 and the contact patterns and pads.

The lower layer openings 336 in the third layer film 330 are formed with smaller diameters than are the lower layer openings in the second layer film 320. Also, the first contact patterns 332 that are connected to the third row of solder balls are led out to the connection pads 336 to the board by the first pullout patterns 335 formed so as to pass between the lower layer contact pads 337.

The contact film 30 set forth in the embodiment aspect described in the foregoing is configured with a total of four layers, namely three layers of films having three lines of openings, etc., and a lowermost layer film for contact verification, corresponding to a BGA device having three rows of solder balls. In order to make this compatible with a device having N rows of solder balls, it is necessary to provide N layers of films in order to effect contact with all of the solder balls. And since it is also necessary to have a lowermost layer film having the second contact patterns for verifying contact therewith, a configuration is required wherein there is a total of N+1 layers.

Figure 7:
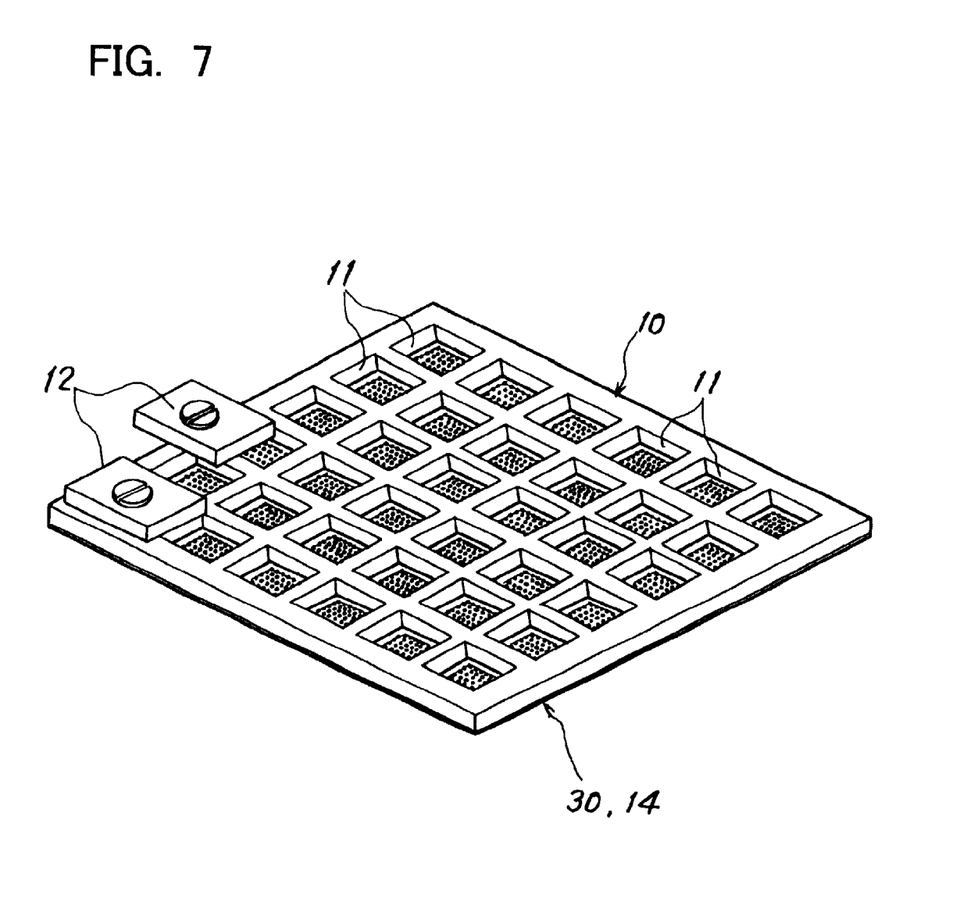
FIG. 7 is a diagonal view of an example of a mounting structure used in burn-in testing.

FIG. 7 is a diagonal view of an example of a mounting structure used in burn-in testing. In this example, a plurality of device accommodating openings 11 is provided in the board 10, an upper cover unit 12 is provided above each accommodating opening 11, and a contact film 30 and pressure plate 14 are deployed on the back side of the accommodating openings 11. In the example diagrammed in FIG. 7, it is possible to mount a plurality of BGA devices on the board 10, making this useful as a mounting structure for use in burn-in testing. The mounting structure diagrammed in FIG. 7 can also be used in device function tests.

As based on the present invention, a contact sheet can be provided wherewith the contact with solder balls can easily be verified for ball grid array type devices. A device mounting structure can also be provided which employs that contact sheet.

The present invention is not limited to or by the embodiment aspect examples described in the foregoing, and includes what is described in the claims and what is equivalent thereto.

What is claimed is:

1. A contact film for effecting electrical contact with a ball grid array device having a plurality of solder balls arranged in a lattice configuration as external terminals, said contact film comprises:

a first flexible insulating film having a plurality of contact openings deployed at positions corresponding to the solder balls and having first contact patterns for effecting a first contact with the solder balls about the periphery of the openings, a second flexible insulating film that is laminated on the first flexible insulating film, having second contact patterns for effecting a second contact with the solder balls through the openings at positions corresponding to the openings, and first pullout patterns connecting to the first contact patterns, and second pullout patterns connecting to the second contact patterns.

2. The contact film according to claim 1, wherein:

the first flexible insulating film has at least first layer and second layer films, in the first layer film whereof are deployed the contact openings and first contact patterns corresponding to the positions of the solder balls in the outermost row, and through holes having diameters larger than the solder balls corresponding to the positions of the solder balls from the second row in, and in the second layer film whereof are provided lower layer openings corresponding to the positions of the solder balls in the outermost row, and the contact openings and first contact patterns corresponding to the positions of the solder balls in the second row, respectively, and the first pullout patterns connecting to the first contact patterns of the solder balls in the outermost row are provided on the first layer film, and the first pullout patterns connecting to the first contact patterns of the solder balls in the second row are provided on the second layer film so as pass between the lower layer openings corresponding to the solder balls in the outermost row.

3. The contact film according to claim 2, wherein:

the first flexible insulating film also has laminated therein an N'th layer film (where N is an integer 3 or greater), in which N'th layer film are provided the contact openings and first contact patterns corresponding to the solder balls in the N'th row.

4. The contact film according to claim 2, wherein:

lower layer contact pads are provided around the lower layer openings, and the lower layer contact pads make contact with the first contact patterns provided on the upper layer.

5. The contact film according to claim 4, wherein:

the lower layer openings have diameters that are smaller than the contact openings provided on the upper layer.

6. The contact film according to claim 5, wherein:

the outer diameters of the lower layer contact pads are smaller than the outer diameters of the first contact patterns corresponding thereto.

7. The contact film according to claim 6, wherein:

the first pullout patterns connecting to the first contact patterns of the solder balls in the second row are provided on the second layer film so that they pass between lower layer contact pads corresponding to the solder balls in the outermost row.

8. The contact film according to claim 2, wherein:

dummy pads are provided around the through holes.

9. A device mounting structure for mounting ball grid array devices in which a plurality of solder balls are arranged in a lattice configuration as external terminals, comprising:

a board having an accommodation opening for accommodating the device; and the contact films according to claim 1, provided on the back side of the board; wherein:

the first and second pullout patterns of the contact film are connected to a wiring pattern in the board.

10. The device mounting structure according to claim 9, wherein:

the contact film is replacably attached by being pressed against the board.

11. The device mounting structure according to claim 10, further having a pressure plate for pressing the contact film against the device, replacably attached on the side of the contact film opposite the board.

12. The device mounting structure according to claim 11, further having an outer frame member having a thickness corresponding to that of the contact film inserted between the pressure plate and the board about the periphery of the contact film.

13. The device mounting structure according to claim 9, further having pressure application means for pressing the device accommodated in the accommodation opening onto the contact film, provided on the back side of the board.

14. The device mounting structure according to claim 9, wherein: a plurality of accommodation openings are provided in the board; and the contact film is provided on the back side of each of those accommodation openings.

15. A test board for testing devices having the device mounting structure according to claim 14.

16. A burn-in board for testing devices having the device mounting structure according to claim 14.

17. A device testing socket having the device mounting structure according to claim 9.

* * * * *